(12) United States Patent
Lin

(10) Patent No.: US 9,640,434 B2
(45) Date of Patent: May 2, 2017

(54) METHOD FOR PROCESSING AN ELECTROPLATED COPPER FILM IN COPPER INTERCONNECT PROCESS

(71) Applicant: SHANGHAI INTEGRATED CIRCUIT RESEARCH AND DEVELOPMENT CENTER CO., LTD., Shanghai (CN)

(72) Inventor: Hong Lin, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 14/759,227

(22) PCT Filed: Aug. 25, 2014

(86) PCT No.: PCT/CN2014/085102
§ 371 (c)(1),
(2) Date: Jul. 5, 2015

(87) PCT Pub. No.: WO2015/165179
PCT Pub. Date: Nov. 5, 2015

(65) Prior Publication Data
US 2016/0247717 A1    Aug. 25, 2016

(30) Foreign Application Priority Data
Apr. 28, 2014  (CN) .......................... 2014 1 0174828

(51) Int. Cl.
*H01L 21/00* (2006.01)
*H01L 21/768* (2006.01)
(Continued)

(52) U.S. Cl.
CPC .. *H01L 21/76879* (2013.01); *H01L 21/02126* (2013.01); *H01L 21/02167* (2013.01);
(Continued)

(58) Field of Classification Search
CPC .......... H01L 23/5226; H01L 23/53238; H01L 21/76879; H01L 21/02126;
(Continued)

(56) References Cited

U.S. PATENT DOCUMENTS 6,025,638 A * 2/2000 Pogge ................. H01L 21/6835
257/420

FOREIGN PATENT DOCUMENTS

| CN | 1575508 A | 2/2005 |
| CN | 101645412 A | 2/2010 |
| WO | WO0245142 | * 6/2002 |

* cited by examiner

*Primary Examiner* — Richard Booth
(74) *Attorney, Agent, or Firm* — Tianchen LLC.

(57) ABSTRACT

A method for processing an electroplated copper film in copper interconnect process is disclosed by the present invention. Firstly, in the copper back-end-of-line interconnect process, the first annealing process for the electroplated copper film is performed at or below 180° C.; then, after the copper back-end-of-line interconnect process, another annealing process with higher temperature (equal or above 240° C.) to the electroplated copper film is performed to make the copper recrystallize, so as to decrease the resistivity of the electroplated copper film and form an interface state having lower resistivity at the interface of the vias bottom, which decrease the contact resistance between the vias and the underlying copper interconnects and further reduce the RC time delay in the vias. The present invention can be applied in the Cu/Low-k back-end-of-line interconnect process and compatible with the standard Cu/Low-k back-end-of-line process integration.

11 Claims, 2 Drawing Sheets

(51) Int. Cl.
*H01L 21/02* (2006.01)
*H01L 21/321* (2006.01)
(52) U.S. Cl.
CPC ...... *H01L 21/3212* (2013.01); *H01L 21/7685* (2013.01); *H01L 21/76802* (2013.01); *H01L 21/76883* (2013.01)
(58) Field of Classification Search
CPC ........... H01L 21/02167; H01L 21/3212; H01L 21/76802; H01L 21/7685; H01L 21/76883
See application file for complete search history.

METHOD FOR PROCESSING AN ELECTROPLATED COPPER FILM IN COPPER INTERCONNECT PROCESS

CROSS-REFERENCE TO RELATED APPLICATION

This application claims the priority benefit of International Patent Application Serial No. PCT/CN2014/0851026, filed Aug. 25, 2014, which is related to and claims the priority benefit of China patent application serial No. 201410174828.9, filed Apr. 28, 2014. The entirety of each of the above-mentioned patent applications is hereby incorporated by reference herein and made a part of this specification.

FIELD OF THE INVENTION

The present invention generally relates to the field of semiconductor manufacturing, more particularly, to a method for processing an electroplated copper film in copper interconnect process which could decrease the contact resistance between the via and underlying metal and further reduce RC time delay.

BACKGROUND OF THE INVENTION

With the semiconductor manufacturing technology entering the sub-65nm technology node, the crosstalk or the electromagnetic interactions caused by proximity effects of various circuit components cannot be neglected, which indirectly influences the RC time delay (resistance-capacitance time delay). The RC time delay in the metal interconnect process has become a main part of the RC time delays in the whole chip manufacturing process.

On the one hand, for reducing the RC time delay between the copper interconnect layers, the conventional $SiO_2$ dielectric material ($k \approx 4.2$) is generally replaced by a dielectric material with a lower k (dielectric constant) value. For the technology nodes between 90 nm and 65 nm, the conventional dielectric material used in the industry is a SiOCH dielectric material with a dielectric constant between 2.6 and 3.0; For the 45 nm technology node and below, a porous SiOCH is used to further decrease the k value, whose dielectric constant value is between 2.0 and 2.5; an organic dielectric material containing C and H is also been used, whose dielectric constant value is between 2.2 and 2.6. Nowadays, the k value for the conventional ultra-low dielectric constant dielectric material has been reduced to about 2.0, however it still can't meet the requirement for further decreasing the metal line width.

On the other hand, thinner barrier layers and seed layers are generally used to increase the volume of copper in a dual damascene structure, so as to reduce the interconnect resistance to control the RC time delay. The magnetron sputtering physical vapor deposition (PVD) is a conventional method for depositing the barrier layers and the seed layers, however which have limitation of step coverage. Therefore, the current research is about using magnetron sputtering to form an ultra-thin tantalum nitride composite layer and an ultra-thin copper manganese seed layer, inserting an ultra-thin cobalt capping layer by chemical vapor deposition method, which further reduces the thickness of the barrier layer and the seed layer with ensuring the copper's gap-fill capability, and then a good result is received. Another exemplary research is about using atomic layer deposition (ALD) method to form the barrier/seed layer using ruthenium (Ru) and the alloy thereof, which receives a good copper gap filling capability and electrical property.

The conventional integration scheme of Cu/Low-k back-end-of-line is the Dual damascene process, including: depositing a intermetal dielectric material on the integrated circuit chip after the front-end-of-line process, positioning the vias and the trenches by the litho process, and then patterning the intermetal dielectric material to form a via pattern and a trench pattern by the dry-etching process; subsequently, removing the post-etch residues of the intermetal dielectric material; next, depositing the barrier layer and the seed layer, filling copper into the vias and trenches and then annealing the copper film; finally, planarizing the integrated circuit chip surface and to form a layer of the metal wiring process.

The thinning of the barrier layer and the seed layer is a general trend and the application of new materials and new deposition technologies are also inevitable. However, the via resistance is still one of the critical factors for the RC time delay in copper interconnects. The via etching process and cleaning process in the copper interconnect process could cause damages to surface of copper interconnects underlying the via; after the cleaning process, the surface of copper interconnects underlying the via exposes to the air, which will be oxidized; a barrier layer is deposited on the surface of copper interconnect underlying the via by a barrier layer deposition process; and the temperature for annealing the electroplated copper film is further decreased due to the introduction of ultra-low k dielectric materials. Those would increase the contact resistance between the copper in the via and the copper in the underlying interconnects, which will result an increase in RC time delay. Several methods have been used to decrease the contact resistance, such as: optimizing the etching process and the cleaning process, controlling queue time between the cleaning process and the depositing process, processing the surface with hydrogen gas before depositing the barrier layer, etching back the barrier layer on the bottom of the via during the barrier layer deposition, prolonging the processing time of annealing duration of the electroplated copper film.

Wherein, among the aforementioned factors which affect the contact resistance, the introduction of the porous low k dielectric material decreases the temperature for annealing the electroplated copper film to 180° C. and below. However, the copper film in the via processed under this temperature is difficult to fully release impurities, thus, the structure with large grain size is difficult to form; even if the anneal duration is extended, the growth of the copper grain in the via is still limited, thus the resistance of the cooper film in the via is relatively high, and the contact resistance of the via is difficult to decrease. Therefore, the conventional annealing process for the electroplated copper film limits the decrease of the contact resistance of the vias. It is necessary to put forward a new method for processing the electroplated copper film, so as to further decrease the contact resistance between the vias and the copper interconnects.

BRIEF SUMMARY OF THE DISCLOSURE

Accordingly, an objective of the present invention is to provide a method for processing an electroplated copper film in copper interconnect process, which can decrease the contact resistance between the copper in the via and the copper in the underlying interconnects, so as to further reduce RC time delay.

The method for processing an electroplated copper film in copper interconnect process according to the present invention includes the following steps:

Step 1: providing an integrated circuit chip which finished front-end-of-line process, and then performing back-end-of-line processes of all layers of copper interconnects by Cu/Low-k dual damascene process; wherein an electrochemical plating process is performed to fill copper in order to form an electroplated copper film, and then performing a first annealing process to the electroplated copper film at or below 180° C.;

Step 2: performing a second annealing process to the electroplated copper film at or beyond 240° C. under an atmosphere of mixed hydrogen and nitrogen, which containing 3.6~4.0 Vol % (volume fraction) of hydrogen gas;

Step 3: performing a final dielectric protective layer deposition of the copper back-end-of-line interconnect process to the chip.

Preferably, in the step 1, the copper back-end-of-line interconnect process includes:

Step 11: depositing a porous dielectric material with low dielectric constant as an inter-metal dielectric;

Step 12: positioning vias and trenches sequentially by two photolithography processes, and patterning the vias and the trenches areas by dry-etching processes;

Step 13: removing the post-etch residues of the inter-metal dielectric by a wet cleaning process;

Step 14: depositing a barrier layer and a seed layer sequentially by physical vapor deposition processes;

Step 15: performing an electrochemical plating process to fill copper in order to form an electroplated copper film, and then performing a first annealing process to the electroplated copper film at or below 180° C.;

Step 16: planarizing the chip surface by a chemical mechanical polishing process and then forming final metal wirings.

Preferably, in the Step 11 mentioned above, a porous SiOCH dielectric material or a SiCN dielectric material is deposited as the intermetal dielectric material.

Preferably, in the step 2, the annealing temperature for the second annealing process is in a range of 240 to 300° C.

Preferably, in the step 2, the annealing temperature range for the second annealing process is in a range of 240 to 260° C.

Preferably, in the step 2, the annealing temperature for the second annealing process is 250° C.

Preferably, in the step 2, the anneal duration for the second annealing process is between 5 and 15 minutes.

The advantage of the present invention is that, in the copper back-end-of-line interconnect process, the first annealing process is performed for the electroplated copper film at or below 180° C., which avoids using higher temperature and prevents negative effects on device manufacturing under higher annealing temperature due to the introduction of intermetal dielectric material having low dielectric constant, especially the porous SiOCH or SiCN inter-metal dielectric material; in addition, the anneal temperature of copper is controlled at and below 180° C., so as to inhibit the grain growth of the electroplated copper film and obtain fine grains which are beneficial to control the occurrence of the dishing in the chemical mechanical polishing process. Next, a second annealing process for the electroplate copper film at or beyond 240° C. after the copper back-end-of-line interconnect process is added, which induces recrystallization of copper to decrease the resistance of the electroplated copper film, so as to improve the contact resistance between the copper in the via and the copper in the underlying interconnects and further reduce RC time delay. Furthermore, since the planarized electroplated copper film is very thin herein, a high-temperature and short-time annealing process will not bring negative effect to the device manufacturing. Therefore, the present invention can be applied in the Cu/Low-k back-end-of-line interconnect process and compatible with in the standard Cu/Low-k back-end-of-line process integration.

DETAILED DESCRIPTION OF THE EMBODIMENTS

The present invention will now be descried more fully hereinafter with reference to the accompanying drawings. This invention may, however, be embodied in different forms and should not be construed as limited to the embodiments set forth herein. It will be understood by those skilled in the art that various changes in form and details may be made herein without departing from the spirit and scope of the invention.

Figure 1:
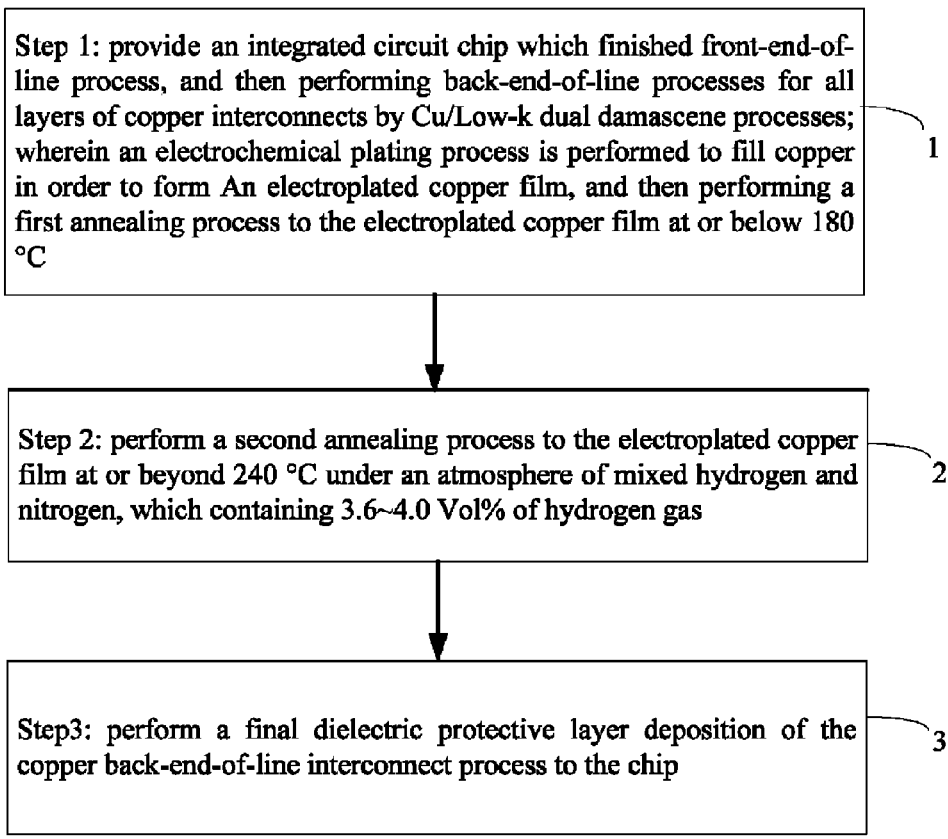
FIG. 1 is a flow chart illustrating the method for processing an electroplated copper film in copper interconnect process according to one embodiment of the present invention

Referring to FIG. 1, illustrating a flow chart of the method for processing an electroplated copper film in copper interconnect process according to one embodiment of the present invention. In the embodiment, the method for processing the electroplated copper film includes the following steps:

As shown in the box 1 of the FIG. 1, the step 1 includes: providing an integrated circuit chip which finished front-end-of-line process, and then performing back-end-of-line processes for all layers of copper interconnects by Cu/Low-k dual damascene process; wherein an electrochemical plating process is performed to fill copper in order to form an electroplated copper film, and then performing a first annealing process to the electroplated copper film lower or equal to 180° C.;

As shown in the box 2 of the FIG. 1, step 2: performing a second annealing process to the electroplated copper film at or beyond 240° C. under an atmosphere of mixed hydrogen and nitrogen, which containing 3.6~4.0 Vol % (volume fraction) of hydrogen gas;

As shown in the box 3 of the FIG. 1, step 3: performing a final dielectric protective layer deposition of the copper back-end-of-line interconnect process to the chip.

In the step 1 of the embodiment mentioned above, the copper back-end-of-line interconnect process can include, but is not limited to the following steps:

Step 11: depositing a porous dielectric material with low dielectric constant as an inter-metal dielectric; preferably, a porous SiOCH dielectric material or a deposited SiCN dielectric material is used as inter-metal dielectric material.

Step 12: positioning vias and trenches sequentially by two photolithography processes, and patterning the vias and the trenches areas by etching processes;

Step 13: removing the post-etch residues of the inter-metal dielectric material by a wet cleaning process;

Step 14: depositing a barrier layer and a seed layer sequentially by physical vapor deposition processes;

Step 15: performing an electrochemical plating process to fill copper in order to form an electroplated copper film, and then performing a first annealing process to the electroplated copper film at or below 180° C.;

Step 16: planarizing the chip surface by a chemical mechanical polishing process and then forming final metal wirings.

In the step 2 of the embodiment mentioned above, by using a hydrogen and nitrogen gas mixture as a protective atmosphere during the annealing process, the second annealing process at or beyond 240° C. for the planarized chip can prevent the electroplated copper film from been oxidized. Wherein the content of the hydrogen gas is controlled between 3.6 and 4.0 Vol %, so as to receive good processing result. As a specific example, the hydrogen content of the hydrogen-nitrogen protective atmosphere is around 3.8 Vol %, under which the second annealing process is performed to the electroplated copper film at or beyond 240° C.

The degree of crystallinity of copper grain is conventionally characterized by X-ray diffraction energy spectrum (XRD). However, with the grain growth of copper, the copper resistivity will remarkably decrease. Therefore, the copper sheet resistance can indirectly show the stability of the crystalline state of copper.

Figure 2:
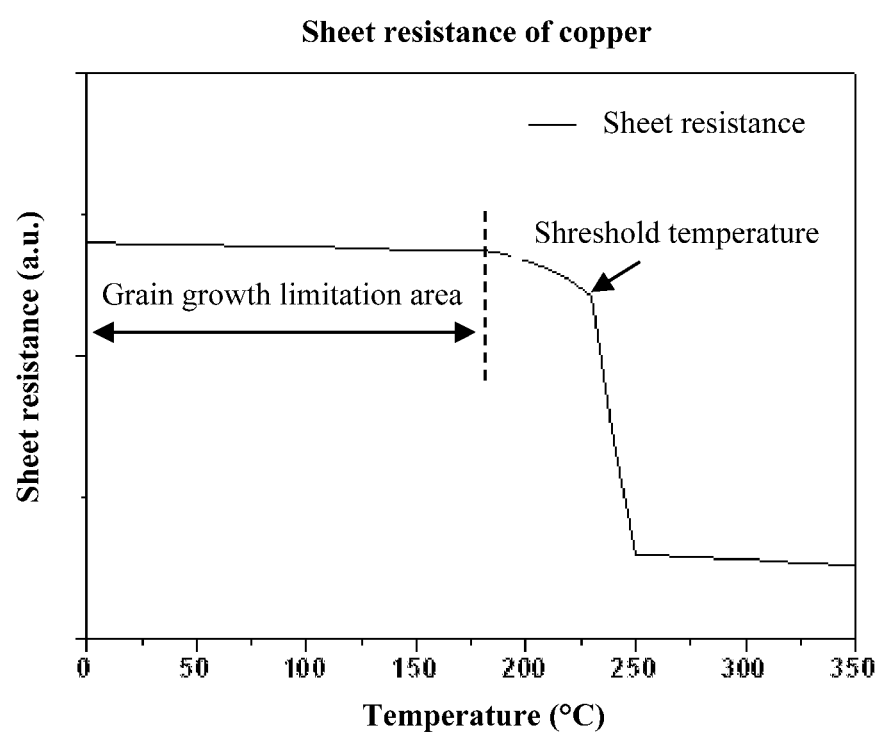
FIG. 2 is a curve illustrating the characteristics of the sheet resistance of the electroplated copper film with a change in temperature according to one embodiment of the present invention

Referring to FIG. 2, FIG. 2 is a curve illustrating the characteristics of the sheet resistance of the electroplated copper film with a change in temperature according to one embodiment of the present invention. As shown in FIG. 2, when the electroplated copper film is annealed at and below 180° C. (the temperature corresponding to the positon of the vertical dashed line on the x axis as shown in the FIG. 2), the sheet resistance of the copper film is essentially constant, herein the grain growth of copper is inhibited (a grain growth inhibition area of copper is between 0° C. and 180° C. as shown in the FIG. 2) and the copper film is in a high impedance state. When the anneal temperature increases beyond 180° C., the sheet resistance of the copper film begins to decrease, which indicates the copper film starts to crystalize slowly. When the anneal temperature reaches a specific threshold (which is pointed out by an arrow as shown in the FIG. 2), the sheet resistance of the copper film will rapidly decrease and the copper grain grows up quickly to reach a stable recrystalline state, herein the copper film is in a low impedance state. The research as shown in the figure indicates that the specific threshold is about 240° C.

Therefore, in the embodiment of the present invention mentioned above, in the copper back-end-of-line interconnect process, the first annealing process is performed to the electroplated copper film at or below 180° C., which avoids using higher temperature, so as to prevent negative effects on device manufacturing under higher annealing temperature due to the introduction of intermetal dielectric material having low dielectric constant, especially the porous SiOCH or SiCN inter-metal dielectric material; in addition, the annealing temperature of copper is controlled at and below 180° C., so as to inhibit the grain growth of the electroplated copper film and obtain fine grains which are beneficial to control the occurrence of the dishing in the chemical mechanical polishing process. Next, a second annealing process for the electroplate copper film at or beyond 240° C. after the copper back-end-of-line interconnect process is added, so as to induce recrystallization of copper, whereby the grains grow up quickly and reach a stable crystalline state, so as to decrease the resistivity of the electroplated copper film. Furthermore, under the combined effect of the recrystallization of the copper in the via and the recrystallization of the copper in the underlying interconnects, an effective diffusion between the electroplated copper film and the barrier layer at the via bottom is to form an interface state having a lower resistivity, which reduce the contact resistance between the copper in the via and the copper in the underlying interconnects and further reduce RC time delay in the vias. Furthermore, since the planarized electroplated copper film is very thin herein, a high-temperature and short-time annealing process will not bring negative effect to the device manufacturing.

Therefore, in a preferable embodiment of the present invention, according to the aforementioned research result, the annealing temperature for the second annealing process is set between 240° C. and 300° C., the annealing time is between 5 and 15 min. When the annealing temperature increases at 240° C. and above, the copper grain grows up quickly to reach a stable crystalline state, whereby the sheet resistance of the copper film rapidly decrease and the copper film is in a low impedance state, which reduces the contact resistance between the copper in the via and the copper in the underlying interconnects and the RC time delay in the via. In addition, according to the annealing temperature, the annealing time for the second annealing process is controlled in a proper short processing time about 5~15 minutes and adjusted also according to the test result of the device characteristic, which can avoid the negative effect from the higher annealing temperature on the chip.

Furthely, in a preferable embodiment of the present invention, the annealing temperature for the second annealing process is set between 240° C. and 260° C., the annealing time is between 5 and 15 min. When the annealing temperature increases at 240° C. and above, the sheet resistance of the copper film begins to rapidly decrease and the copper film is in a low impedance state; When the annealing temperature is at 250° C. and above, the sheet resistance of the copper film is decreased gently, therefore, a good processing effect can be obtained by the second annealing process beyond 250° C. However, while annealing temperature over high, it can also bring negative effect to the chip, thus, the upper limit of the annealing temperature for the second annealing process is preferably not beyond 260° C.

Furthermore, in a preferred embodiment of the present invention, the annealing temperature for the second annealing process is set at 250° C., the annealing time is 10 minutes. Since the decrease of the sheet resistance of the copper film is gentle at the annealing temperature of 250° C. and is little influenced by continuing to increase the annealing temperature, thus, 250° C. becomes the preferred annealing temperature and can avoid the negative effect from the higher annealing temperature on the chip.

It is noted that according to the research result of the inventor of the present invention, when the annealing temperature of the copper film reaches 250° C. and above, the decrease of the sheet resistance of the copper film tends to be gentle, and the grain growth of copper has reached a stable state. Therefore, when the annealing temperature is beyond 250° C., it has no practical significance to continue to use higher annealing temperature such as beyond 300° C. in the annealing process for processing the electroplated copper film.

The method for processing an electroplated copper film used in a semiconductor copper interconnect process according to the present invention includes: firstly, in the copper back-end-of-line interconnect process, the first annealing process for the electroplated copper film is performed at or below 180° C.; then, after the copper back-end-of-line interconnect process, another annealing process with higher temperature (equal or above 240° C.) to the electroplated copper film is performed to make the copper recrystallize, so as to decrease the resistivity of the electroplated copper film and form an interface state having lower resistivity at the interface of the via bottom, which decrease the contact resistance between the copper in the via and the copper in the underlying interconnects and further reduce the RC time delay of the vias. Therefore, the present invention effectively solves the problem produced in the conventional technology, which can be applied in the Cu/Low-k back-end-of-line interconnect process and compatible with the standard Cu/Low-k back-end-of-line process integration.

While this invention has been particularly shown and described with references to preferred embodiments thereof, it will be understood by those skilled in the art that various changes in form and details may be made herein without departing from the spirit and scope of the invention as defined by the appended claims.

The invention claimed is:

1. A method for processing an electroplated copper film in copper interconnect process includes the following steps:
    Step 1: providing an integrated circuit chip which finished front-end-of-line process, and then performing back-end-of-line processes for all layers of copper interconnects by Cu/Low-k dual damascene processes; wherein an electrochemical plating process is performed to fill copper in order to form an electroplated copper film, and then a first annealing process is performed to the electroplated copper film at or below 180° C. to inhibit grain growth of the electroplated copper film;
    Step 2: performing a second annealing process to the electroplated copper film at or beyond 240° C. under an atmosphere of mixed hydrogen and nitrogen, which containing 3.6~4.0 Vol % of hydrogen gas, to increase the grain growth of the electroplated copper film to reach a stable crystalline state;
    Step 3: performing a final dielectric protective layer deposition of the copper back-end-of-line interconnect process to the chip.

2. The method according to claim 1, wherein in the step 1, the copper back-end-of-line interconnect process includes:
    Step 11: depositing a porous dielectric material with low dielectric constant as an inter-metal dielectric;
    Step 12: positioning vias and trenches sequentially by two photolithography processes, and patterning the vias and the trenches areas by etching processes;
    Step 13: removing the post-etch residues of the inter-metal dielectric by a wet cleaning process;
    Step 14: depositing a barrier layer and a seed layer sequentially by physical vapor deposition processes;
    Step 15: performing an electrochemical plating process to fill copper in order to form an electroplated copper film, and then performing a first annealing process to the electroplated copper film at or below 180° C.;
    Step 16: planarizing the chip surface by a chemical mechanical polishing process and then forming final metal wirings.

3. The method for processing an electroplated copper film in copper interconnect process according to claim 2, wherein in the Step 11 mentioned above, a porous SiOCH dielectric material or a SiCN dielectric material is deposited as the inter-metal dielectric material.

4. The method for processing an electroplated copper film in copper interconnect process according to claim 1, wherein in the step 2, the annealing temperature for the second annealing process is in a range of 240 to 300° C.

5. The method for processing an electroplated copper film in copper interconnect process according to claim 4, wherein in the step 2, the annealing temperature for the second annealing process is in a range of 240 to 260° C.

6. The method for processing an electroplated copper film in copper interconnect process according to claim 5, wherein in the step 2, the annealing temperature for the second annealing process is 250° C.

7. The method for processing an electroplated copper film in copper interconnect process according to claim 1, wherein in the step 2, the annealing time for the second annealing process is between 5 and 15 minutes.

8. The method for processing an electroplated copper film in copper interconnect process according to claim 4, wherein in the step 2, the annealing time for the second annealing process is between 5 and 15 minutes.

9. The method for processing an electroplated copper film in copper interconnect process according to claim 5, wherein in the step 2, the annealing time for the second annealing process is between 5 and 15 minutes.

10. The method for processing an electroplated copper film in copper interconnect process according to claim 6, wherein in the step 2, the annealing time for the second annealing process is between 5 and 15 minutes.

11. The method for processing an electroplated copper film in copper interconnect process according to claim 7, wherein in the step 2, the annealing time for the second annealing process is 10 minutes.

* * * * *